(12) United States Patent
Spinali

(10) Patent No.: US 6,449,106 B1
(45) Date of Patent: Sep. 10, 2002

(54) CATADIOPTRIC LENS BARREL STRUCTURE HAVING A SUPPORT STRUCTURE TO MAINTAIN ALIGNMENT OF A PLURALITY OF SUB-BARRELS

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,064

(22) Filed: Aug. 10, 2000

(51) Int. Cl.[7] .................................................. G02B 7/02
(52) U.S. Cl. ....................................... 359/811; 359/821
(58) Field of Search ................................ 359/811, 819, 359/821

(56) References Cited

U.S. PATENT DOCUMENTS

| | | | | |
|---|---|---|---|---|
| 2,794,360 A | * | 6/1957 | Eagle ........................... | 359/611 |
| 3,722,996 A | | 3/1973 | Fox .............................. | 355/53 |
| 5,526,194 A | * | 6/1996 | Ruffell ........................ | 359/827 |
| 5,576,895 A | | 11/1996 | Ikeda .......................... | 359/811 |
| 5,610,686 A | | 3/1997 | Osanai ......................... | 355/72 |
| 5,638,223 A | * | 6/1997 | Ikeda .......................... | 359/827 |
| 5,680,251 A | | 10/1997 | Kato et al. ................... | 359/557 |
| 5,973,863 A | * | 10/1999 | Hatasawa et al. ........... | 359/823 |
| 6,122,114 A | * | 9/2000 | Sudo et al. .................. | 359/819 |

\* cited by examiner

Primary Examiner—Ricky Mack
(74) Attorney, Agent, or Firm—Finnegan Henderson Farabow Garrett & Dunner, L.L.P.

(57) ABSTRACT

A catadioptric lens barrel structure for a projection exposure apparatus includes a pair of lens barrels. Each lens barrel has an optical axis and comprises a plurality of sub-barrels which are serially aligned along the corresponding optical axis. The optical axes of the lens barrels run substantially parallel to each other. A reticle is placed in front of an entrance end of a first one of the lens barrels and a wafer is placed in front of an exit end of the second lens barrel. A support structure supports each sub-barrel. A plurality of adjustment articles may be provided to correct the substantially parallel alignment of the optical axes. Each sub-barrel is spaced apart from the others in the series so that each sub-barrel can slide in and out of alignment with the corresponding optical axis and each sub-barrel can be individually attached to or detached from the support structure. The support structure is made of a material having a low coefficient of thermal expansion and is designed to minimize errors due to temperature changes, vibrational motion, or other external forces.

18 Claims, 9 Drawing Sheets

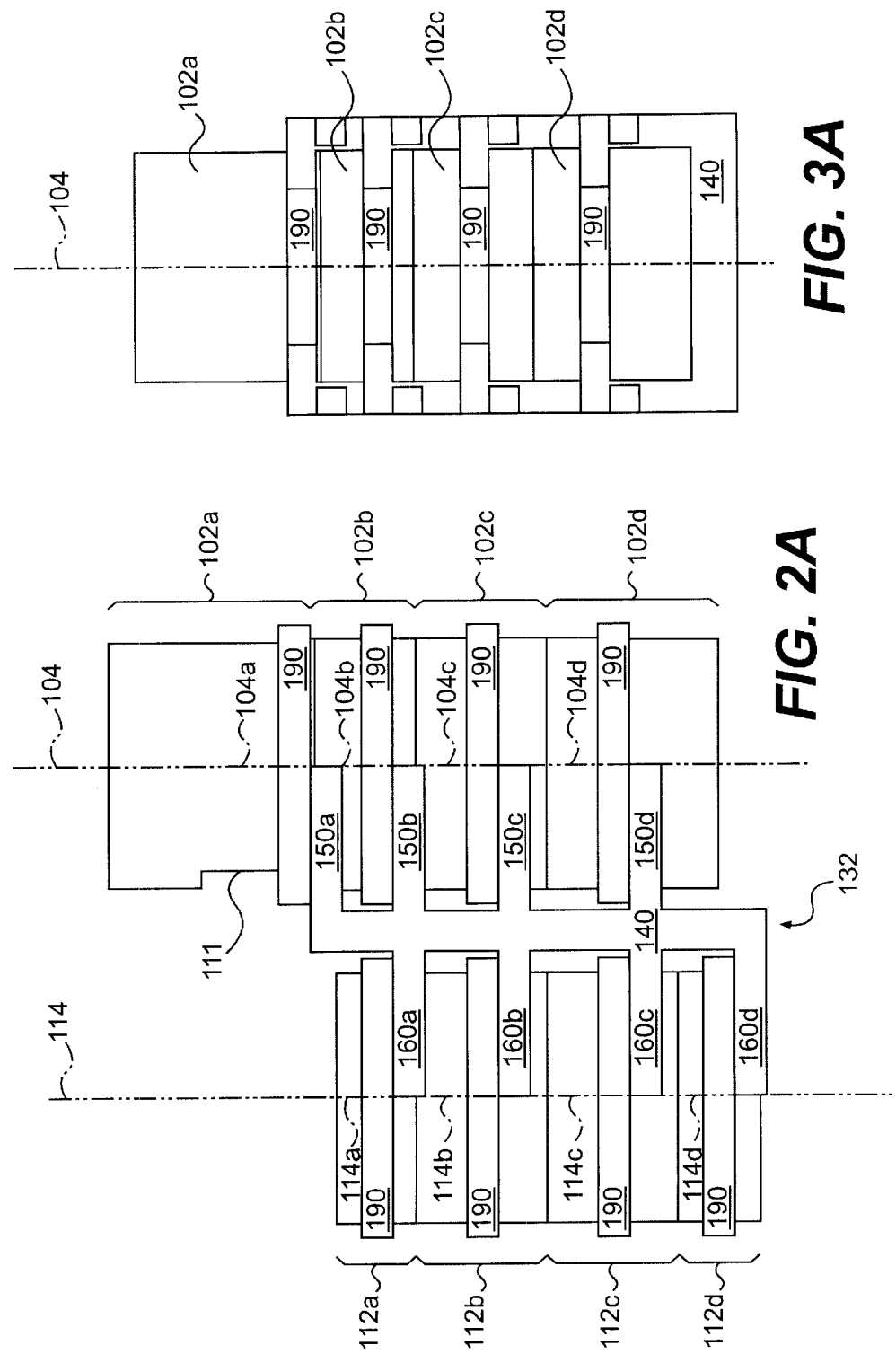

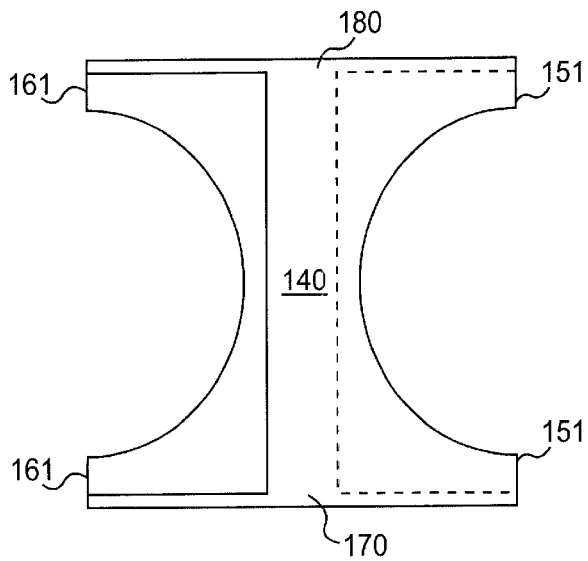
FIG. 6
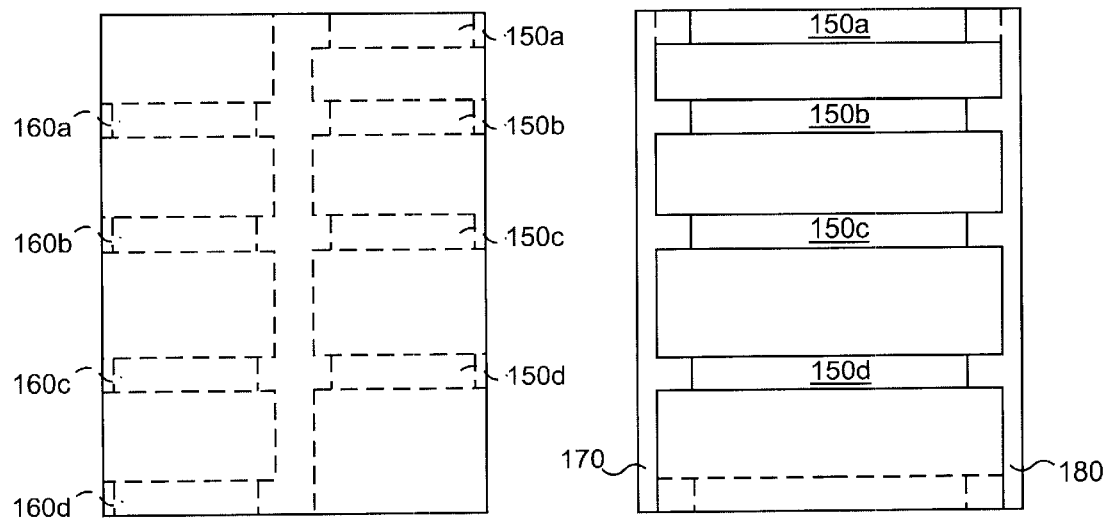
FIG. 7  FIG. 8

CATADIOPTRIC LENS BARREL STRUCTURE HAVING A SUPPORT STRUCTURE TO MAINTAIN ALIGNMENT OF A PLURALITY OF SUB-BARRELS

BACKGROUND OF THE INVENTION

1. Field of the Invention

This invention relates to a catadioptric lens barrel which can be attached to an optical projection unit, such as a projection exposure apparatus used to manufacture semiconductor wafers. More particularly, the present invention relates to a catadioptric lens barrel structure including its support structure. The lens barrel structure comprises a plurality of lens barrels aligned in parallel, and each lens barrel comprises a plurality of sub-barrels.

2. Description of the Related Art

A lens barrel is a tubular mechanical structure containing a series of lenses which are aligned to transfer an image from one end of the lens barrel to the other. The lens barrel may include a sturdy threaded body and durable metal retaining rings, often referred to as a sub-barrel, to carry a series of lens holders, commonly referred to as cells. Another type of lens barrel is known as a catadioptric lens barrel. A catadioptric lens barrel contains not only refractive elements, such as lenses, but also reflective elements, such as mirrors.

Both of these lens barrel designs are used in conventional optical systems. For example, an optical projection unit often has a lens barrel and may be used in a projection exposure apparatus for production of semiconductor wafers. The projection exposure apparatus includes a reticle positioned near an entrance end of the lens barrel and a semiconductor wafer positioned near an exit end. The projection exposure apparatus shines light through the reticle, optically reduces a pattern on the reticle, and transfers the pattern through the lens barrel onto a predetermined area on the semiconductor wafer. The semiconductor wafer is a silicon wafer with a photo-sensitive coating or layer for making semiconductor devices, such as microprocessor or memory chips.

A catadioptric lens barrel system using two or more parallel lens barrels offers benefits not found in conventional single barrel systems. Placing the lens barrels in parallel reduces the overall height of the lens barrel system, but increases the overall width. Reduced height is important for many reasons, such as for ease of transport. This type of catadioptric lens barrel design, however, poses several problems. First, keeping proper alignment of a plurality of parallel lens barrels can be difficult. Second, the focus depth of the projection system changes as temperature changes. Coefficients of thermal expansion of the lens barrels and their internal components, and the indices of refraction of the lens materials vary with temperature. Errors related to these factors collectively alter the focusing properties of the optical system. Third, the parallel lens barrel structure tends to be more sensitive to movement or vibration than conventional single barrel designs.

In light of the foregoing, there is a need for a catadioptric lens barrel structure that holds the lens barrels stably and accurately, and minimizes distortion errors due to temperature changes, vibrational, or other external forces, so that the reticle pattern remains focused as it is transferred and reduced to the wafer.

SUMMARY OF THE INVENTION

Apparatus and methods consistent with the principles of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, one aspect of the invention is directed to a stable lens barrel structure that minimizes the effects of environmental changes. The lens barrel structure may be used, for example, in a projection exposure apparatus in semiconductor manufacturing to reduce a pattern on a reticle through the projection exposure apparatus to a semiconductor wafer.

The lens barrel structure comprises a lens barrel and a support structure. The lens barrel comprises a plurality of sub-barrels serially aligned along an optical axis of the lens barrel. Each sub-barrel has an optical sub-axis. The plurality of optical sub-axes substantially coincide with the optical axis. The support structure supports each sub-barrel and maintains the alignment of the corresponding optical sub-axes to the optical axis. A second aspect of the invention is directed to a lithography system comprising a lens barrel structure consistent with such a lens barrel system.

A third aspect of the invention is directed to a lens barrel structure comprising a plurality of lens barrels and a support structure. Each lens barrel comprises a plurality of sub-barrels aligned along an optical axis of the lens barrel. The optical axes of the lens barrels are substantially parallel to each other while the optical sub-axes are serially aligned along the corresponding optical axis of each lens barrel. The support structure supports each sub-barrel and maintains the substantial parallel alignment of the optical axes. A fourth aspect of the invention is directed to a lithography system comprising a lens barrel structure consistent with such a lens barrel system.

A fifth aspect of the invention is directed to a method for aligning a plurality of sub-barrels serially aligned along an optical axis. Each sub-barrel has an optical sub-axis. The plurality of optical sub-axes substantially coincide with the optical axis of the lens barrel. The method comprises the steps of supporting each sub-barrel and maintaining the alignment of each optical sub-axis to the optical axis using a plurality of adjustment articles.

A sixth aspect of the invention is directed to a method for making a lens barrel structure. The method comprises the step of providing at least one lens barrel. Each lens barrel comprises an optical axis and a plurality of sub-barrels. Each sub-barrel has an optical sub-axis. The optical axes of the lens barrels are substantially parallel to each other. The sub-barrels are serially aligned along the corresponding optical axis of the lens barrel. The method also comprises the step of supporting each lens barrel to maintain the substantially parallel alignment of the optical axes, and the step of removably fastening each sub-barrel to a support structure.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIG. 2A is an elevation view of the catadioptric lens barrel structure of FIG. 1A;

FIG. 3A is a side view of the catadioptric lens barrel structure of FIG. 2A;

FIG. 6 is a top view of the support structure;

FIG. 7 is an elevation view of the support structure;

FIG. 8 is a side view of the support structure;

DESCRIPTION OF THE INVENTION

Reference will now be made in detail to the embodiments of the invention, examples of which are illustrated in the accompanying drawings. Wherever possible, the same reference numbers will be used throughout the drawings to refer to the same or like parts. The invention will be further clarified by the following examples, which are intended to be exemplary of the invention.

A catadioptric lens barrel structure comprises a pair of parallel lens, barrels and a support structure configured to provide enhanced stability and made out of materials that reduce the effects of environmental changes on the lens barrel structure. Each lens barrel has an optical axis and comprises a plurality of sub-barrels serially aligned along the corresponding optical axis. Each sub-barrel stands apart from the others in the series so that each sub-barrel can slide in and out of alignment with the corresponding optical axis, and therefore can be individually attached to or detached from the support structure. The support structure has a plurality of support platforms to support the sub-barrels. The support structure is made of a material having a low coefficient of thermal expansion, which reduces the effects of environmental changes on the lens barrel structure.

In accordance with the principles of the invention, a catadioptric lens barrel structure is provided with at least one lens barrel. Each lens barrel has an optical axis along its length and comprises a plurality of sub-barrels serially aligned along the corresponding optical axis. When the lens barrel structure comprises more than one lens barrel, the plurality of optical axes run substantially parallel to each other.

Figure 1A:
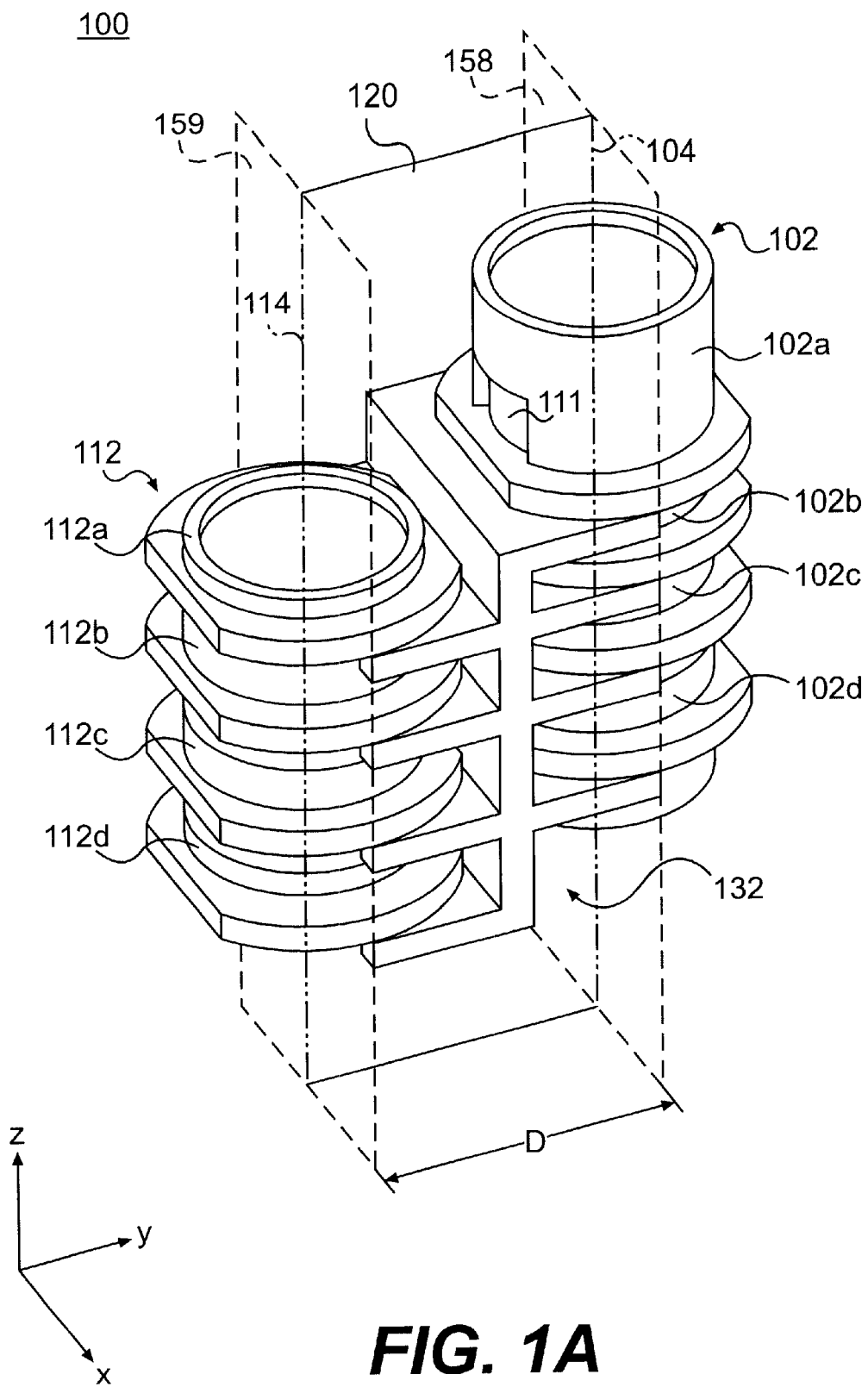
FIG. 1A is a perspective view of a catadioptric lens barrel structure consistent with the principles of the present invention.
Figure 1B:
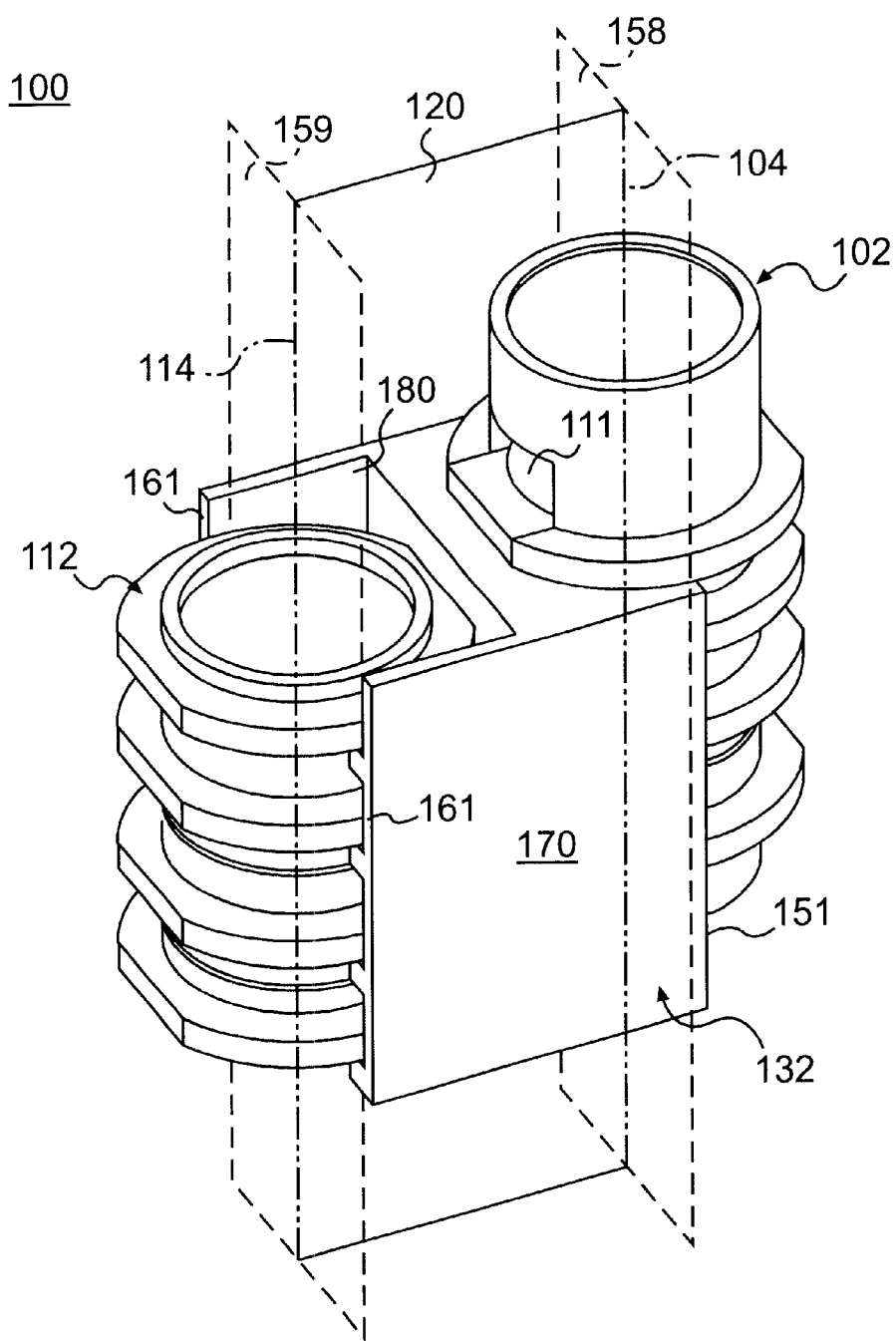
FIG. 1B is a perspective view of a catadioptric lens barrel structure of FIG. 1A illustrating a support structure having lateral support panels.

In one embodiment, as illustrated in FIGS. 1A and 1B, a catadioptric lens barrel structure 100 comprises a pair of lens barrels including a first lens barrel 102 and a second lens barrel 112. First lens barrel 102 has a first optical axis 104 running along its length. Similarly, second lens barrel 112 has a second optical axis 114 running along its length. The first and second optical axes 104 and 114, respectively, are substantially parallel to each other and define a frontal plane 120. Frontal plane 120 and first optical axis 104 define a first optical plane 158 perpendicular to frontal plane 120 and passing through first optical axis 104. Frontal plane 120 and second optical axis 114 define a second optical plane 159 perpendicular to frontal plane 120 and passing through second optical axis 114.

Generally, there are two types of conventional lens barrels. One type carries a plurality of lens holders ("cells"), on which lenses are mounted. The plurality of lens holders are stacked in a serial orientation along the optical axis of the lens barrel. A second type of lens barrel is constructed of a series of sub-barrels connected end-to-end by fasteners. Lens barrels consistent with the principles of the present invention also comprise a series of sub-barrels aligned along an optical axis, similar to the conventional types. Unlike the two conventional types, however, the sub-barrels of the present invention stand apart from each other and are not connected end-to-end by fasteners.

Figure 3B:
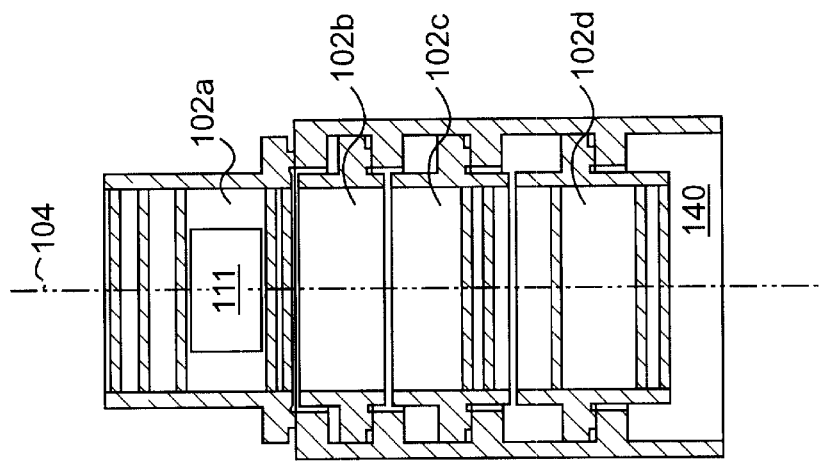
FIG. 3B is a sectional view of the catadioptric lens barrel structure taken along line III—III of FIG. 2B.
Figure 2B:
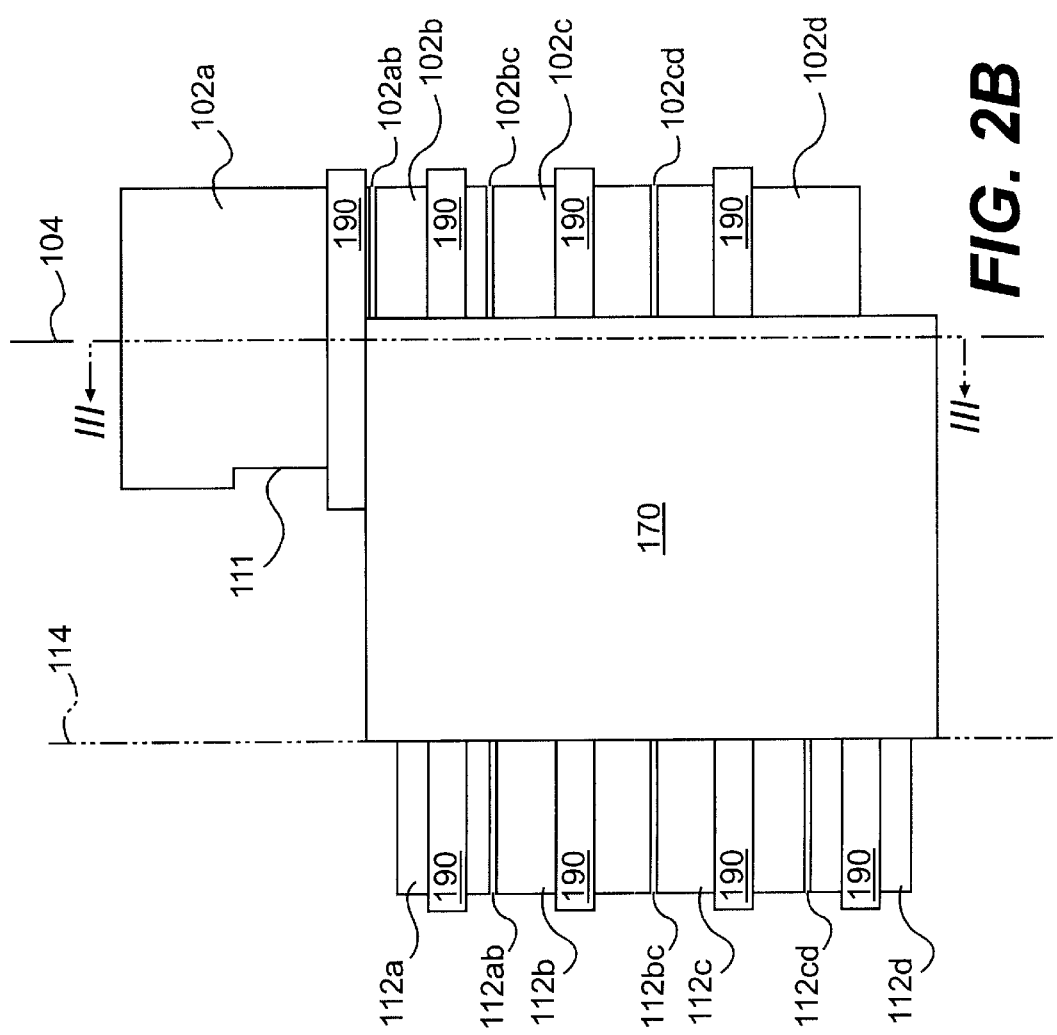
FIG. 2B is an elevation view of the catadioptric lens barrel structure of FIG. 1B.

FIGS. 2A and 2B illustrate front views of the lens barrel structure 100 shown in FIGS. 1A and 1B, respectively. FIG. 3A illustrates a side view of the lens barrel structure 100 shown in FIG. 2A, and FIG. 3B illustrates a sectional view of lens barrel structure 100 taken from line III—III of FIG. 2B. First lens barrel 102 comprises a plurality of sub-barrels 102a, 102b, 102c, 102d, and a corresponding plurality of sub-axes 104a, 104b, 104c, 104d, respectively (best shown in FIG. 2A). Sub-axes 104a, 104b, 104c, and 104d substantially coincide with first optical axis 104. Likewise, second lens barrel 112 comprises a plurality of sub-barrels 112a, 112b, 112c, 112d, and a corresponding plurality of sub-axes 114a, 114b, 114c, 114d, respectively. Sub-axes 114a, 114b, 114c, and 114d substantially coincide with second optical axis 114.

In one embodiment, there is a gap (best shown in FIG. 2B) between two consecutive sub-barrels to provide clearances so that sub-barrels can slide in and out of alignment with the respective optical axis of the lens barrel. For example, gap 102ab is provided between sub-barrels 102a and 102b, gap 102bc between sub-barrels 102b and 102c, and gap 102cd between sub-barrels 102c and 102d. Similarly, gap 112ab is provided between sub-barrels 112a and 112b, gap 112bc between sub-barrels 112b and 112c, and gap 112cd between sub-barrels 112c and 112d. Gaps 102ab, 102bc, and 102cd, provide clearance so that sub-barrels 102a, 102b, 102c, and 102d, respectively, can slide in and out of alignment with first optical axis 104. Likewise, gaps 112ab, 112bc, and 112cd provide clearance so that sub-barrels 112a, 112b, 112c, and 112d, respectively, can slide in and out of alignment with second optical axis 114.

Sub-barrels 102a, 102b, 102c, 102d, and sub-barrels 112a, 112b, 112c, 112d, can be made of stainless steel, silicon carbide, brass, brass alloy, or other suitable materials for a lens barrel. For example, stainless steel commonly known in the industry as SS 17-7PH, SS 440 series, or SS 300 series may be used. To minimize distortion errors due to environmental changes, sub-barrels 102a, 102b, 102c, 102d, and sub-barrels 112a, 112b, 112c, 112d, may be made of materials having low coefficients of thermal expansion. The coefficient of thermal expansion may be as low as 6 ppm/°

C. Some examples of materials having this property include alumina ceramic ($Al_2O_3$), Invar, Ultra Low Expansion™ (ULE) glass, Zerodur glass, and silicon carbide (SiC).

Also, consistent with the principles of the invention, catadioptric lens barrel structure 100 may comprise transverse lens barrel 122 (schematically shown in FIG. 4) connecting first lens barrel 102, through an opening 111, to second lens barrel 112. A first end of transverse lens barrel 122 is positioned inside first lens barrel 102 and carries a first mirror 124. A second end is positioned above second lens barrel 112 and carries a second mirror 126. First mirror 124 is positioned along, and has an angular orientation with respect to first optical axis 104. Second mirror 126 is positioned along, and has an angular orientation with respect to second optical axis 114. The positional relation among mirrors 124, 126, and optical axes 104, 114, will be explained in greater detail below with respect to FIG. 4.

Transverse lens barrel 122 in one embodiment is made of a material having a low coefficient of thermal expansion. For example, the coefficient of thermal expansion may be as low as 6 ppm/° C. or below. Some materials having this property include alumina ceramic ($Al_2O_3$), Invar, ULE™ glass, Zerodur glass, and silicon carbide (SiC). The reason for selecting this material will be explained below with respect to the discussion on the support structure.

Figure 4:
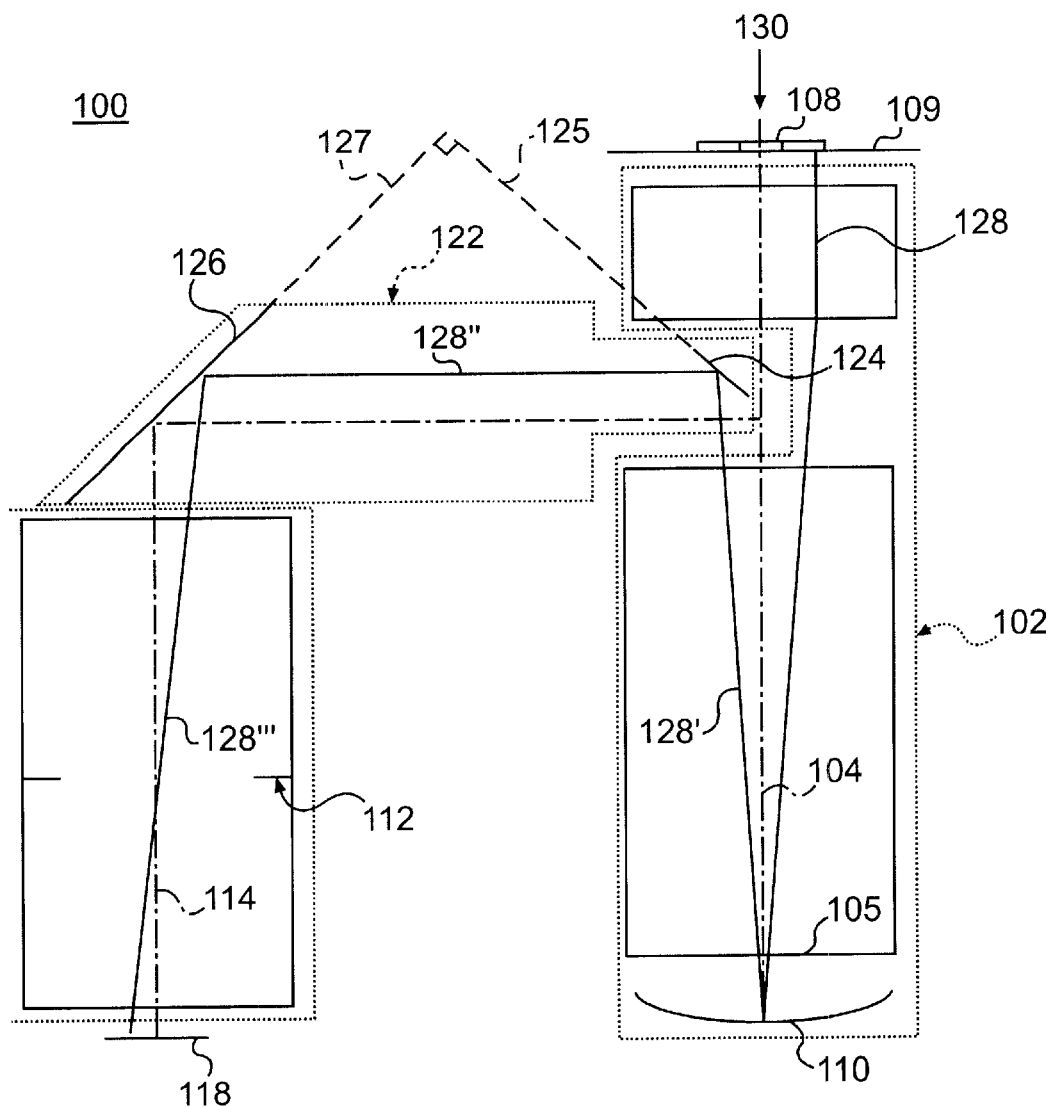
FIG. 4 is a schematic diagram of the catadioptric lens barrel structure consistent with the principles of the invention, illustrated with light beam passing through the lens barrel structure.
Figure 5:
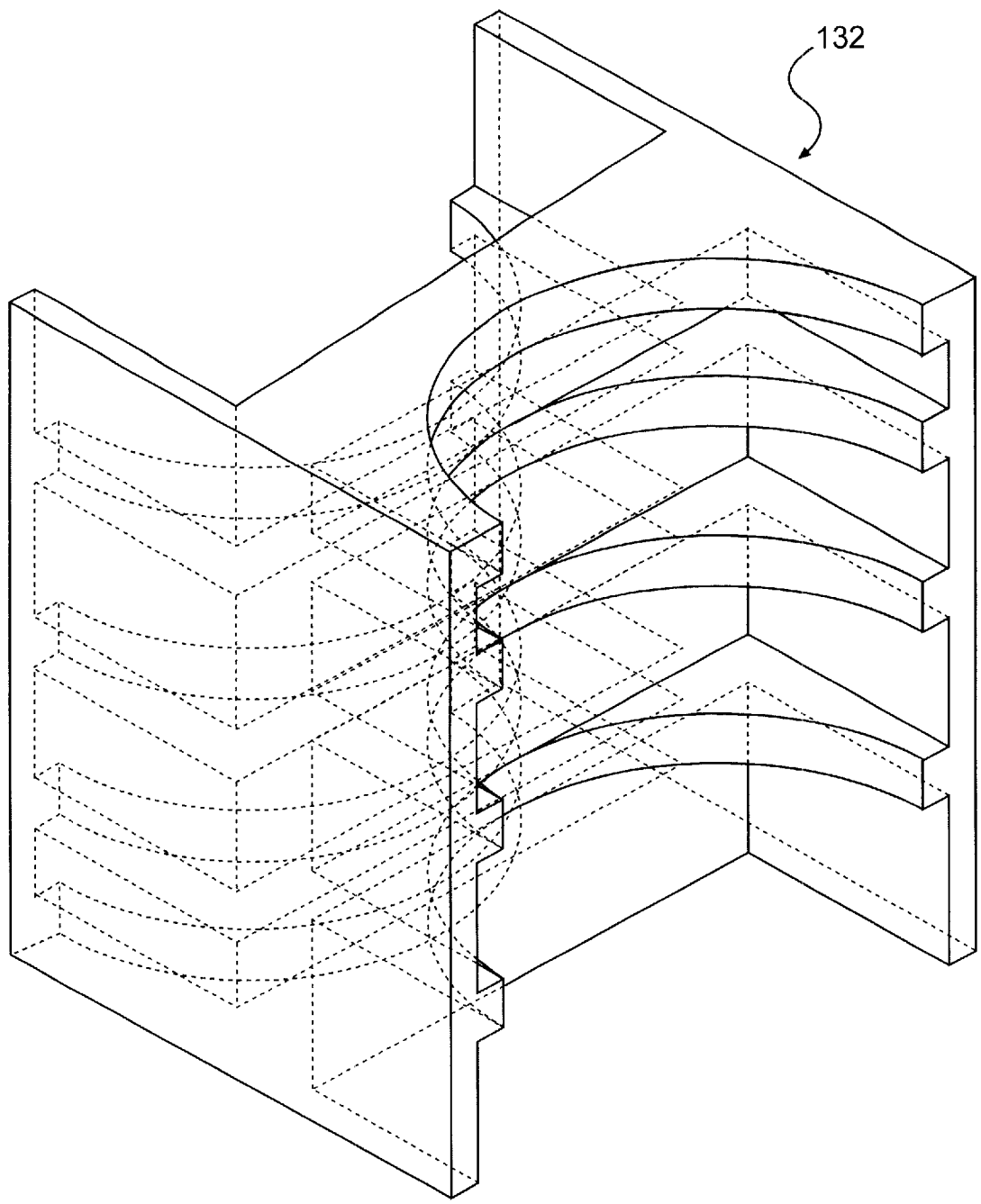
FIG. 5 is a perspective view of the support structure.

FIG. 4 illustrates the path of a light beam 128 through lens barrel structure 100. Light source 130 illuminates reticle 108 to create light beam 128, which enters first lens barrel 102. Reticle 108 is located on image plane 109. Light beam 128 is reflected off of mirror 110, as light beam 128', which travels back through first lens barrel 102. Light beam 128' then hits first mirror 124 carried inside transverse lens barrel 122, is reflected off of first mirror 124, as light beam 128", which is reflected off of second mirror 126, as light beam 128'''. Light beam 128''' travels through second lens barrel 112 and hits wafer 118. Mirrors 124 and 126 are preferably oriented at 45° angle from light beams 128' and 128", respectively. Therefore, in this embodiment, if imaginary extension lines 125 and 127 are drawn from mirrors 124 and 126, respectively, it will be shown that mirrors 124 and 126 are aligned substantially perpendicular to each other.

Further, consistent with the principles of the invention, the catadioptric lens barrel structure is provided with a support structure. The support structure preferably includes a main support panel and a plurality of support platforms. The main support panel is positioned between the lens barrels, and substantially parallel to the optical axes. The support platforms are configured to extend from the main support panel, in part toward the first optical axis and in part toward the second optical axis. Each support platform supports a sub-barrel. In one embodiment, each support platform partially circumscribes the sub-barrel. The support structure may include a pair of lateral support panels to provide added support to the support platforms. The lateral support panels are appressed against the support platforms. The support structure may also include an upper support structure connected to the main support panel and/or the lateral support panels to support the transverse lens barrel.

In the embodiment shown in FIGS. 1A and 2A, catadioptric lens barrel structure 100 comprises support structure 132. Support structure 132 preferably includes a main support panel 140, a plurality of support platforms 150a, 150b, 150c, 150d, and 160a, 160b, 160c, 160d. Support platforms 150a, 150b, 150c, and 150d, extend from main support panel 140 toward first optical axis 104, and partially circumscribe sub-barrels 102a, 102b, 102c, and 102d, respectively. Support platforms 160a, 160b, 160c, and 160d, extend from main support panel 140 toward second optical axis 114, and partially circumscribe sub-barrels 112a, 112b, 112c, and 112d, respectively.

In the embodiment shown in FIGS. 1B and 2B, support structure 132 may further include a pair of lateral support panels 170, 180 to provide added support to support platforms 150a, 150b, 150c, 150d, and 160a, 160b, 160c, 160d. Lateral support panels 170 and 180 are appressed against support platforms 150a, 150b, 150c, 150d, and 160a, 160b, 160c, 160d. Lateral support panels 170 and 180 may run parallel to each other. Alternatively, lateral support panels 170 and 180 may stand vertically and converge toward either the first or second lens barrel, 102 or 112, respectively, depending on the overall diameters of the lens barrels. The width of support platforms 150a, 150b, 150c, 150d, and 160a, 160b, 160c, 160d, preferably extend from a first mounting edge 151, which is aligned with first optical plane 158, to a second mounting edge 161, which is aligned with second optical plane 159. The height of support structure 132 generally depends on the height of second lens barrel 112, although this is not a requirement. Support structure 132 may also include an upper support structure (not shown) to support transverse lens barrel 122. The upper support structure may connect to main support panel 140 and/or lateral support panels 170, 180 to support transverse lens barrel 122. FIGS. 5–8 illustrate perspective, top, front and side views, respectively, of support structure 132.

Further, consistent with the principles of the invention, support structure 132, including main support panel 140, support platforms 150a, 150b, 150c, 150d, and 160a, 160b, 160c, 160d, and, if provided, lateral support panels 170, 180, and the upper support structure, are preferably made of a material having a low coefficient of thermal expansion. For example, the coefficient of thermal expansion may be as low as 6 ppm/° C. or below. Similar to the materials for transverse lens barrel 122, materials having this property include alumina ceramic ($Al_2O_3$), Invar, ULE™ glass, Zerodur glass, and silicon carbide (SiC) as shown in Table 1 below.

TABLE 1

| Materials | Coefficients of Thermal Expansion |
| --- | --- |
| Alumina Ceramic ($Al_2O_3$) | 5.7 ppm/° C. |
| Invar | 0.64–3.11 ppm/° C. (depending on heat treatment) |
| ULE ™ | 0.03 ppm/° C. |
| Zerodur | 0.05 ppm/° C. |
| Silicon Carbide (SiC) | 0.4–5.1 ppm/° C. (depending on temperature range) |

One advantage of using low expansion materials for lens barrel support structure 132 and transverse lens barrel 122 is to minimize errors related to distortion, such as expansion or contraction, of the catadioptric lens barrel structure 100 due to environmental changes such as temperature changes. When temperature changes, either increases or decreases, the sub-barrels and the support structure will expand or contract accordingly. For example, the change in length of the lens barrel ($\Delta L$) can be mathematically determined according to this expression:

$$\Delta L = \alpha \cdot L \cdot \Delta T$$

wherein $\alpha$ is the coefficient of thermal expansion of the material of the lens barrel; L is the initial length of the lens barrel; and $\Delta T$ is the temperature difference or final temperature subtracted from initial temperature. Thus, a sub-barrel having a length L will experience a change in length by ΔL. This change in length will affect the alignment of the support structure and the transverse lens barrel, as well as the plurality of lenses and mirrors inside the lens barrels, and cause a substantial error when the wafer receives the reticle pattern.

Consistent with the principles of the invention, distance D is a key parameter of catadioptric lens barrel structures. In one embodiment, components of support structure 132 are made of the same low-expansion material such as those in Table 1. Therefore, support structure 132 expands and contracts, if at all, at the same rate. First mounting edges 151 substantially maintain first optical axis 104, while second mounting edges 161 substantially maintain second optical axis 114, so that optical axes 104 and 114 remain substantially parallel and distance D remains substantially constant. Transverse lens barrel 122 may also be made of a low-expansion material, such as those in Table 1, and preferably, although not necessarily, of the same material as support structure 132. If transverse lens barrel 122 is made of a different material than support structure 132, then some kind of adjustment mechanism will be needed. Such adjustment mechanism may include, for example, a set of flexures located inside transverse lens barrel 122.

Also consistent with the principles of the invention, a catadioptric lens barrel structure is provided with a plurality of flanges. Each flange is attached to a sub-barrel around an outer circumference thereof and is removably secured to a corresponding support platform.

FIGS. 1A–3B show catadioptric lens barrel structure 100 comprising a plurality of flanges 190. As best shown in FIGS. 2A and 2B, each flange 190 is attached to a respective sub-barrel 102a, 102b, 102c, 102d, or 112a, 112b, 112c, 112d, around an outer circumference thereof, and is removably secured to a corresponding support platform 150a, 150b, 150c, 150d, or 160a, 160b, 160c, 160d, respectively. Flanges 190 are shown to have a circular shape with segment cuts on two opposing edges to facilitate a more compact structural design by positioning first and second lens barrels 102, 112 closer together.

Further consistent with the principles of the invention, the catadioptric lens barrel structure is provided with a plurality of adjustment articles to adjust alignment of each sub-barrel in all three linear directions and all three angular directions. The adjustment articles maintain the substantially coinciding alignment of each optical sub-axis to the optical axis, as well as maintain distance D and the substantially parallel alignment of the optical axes.

Figure 10:
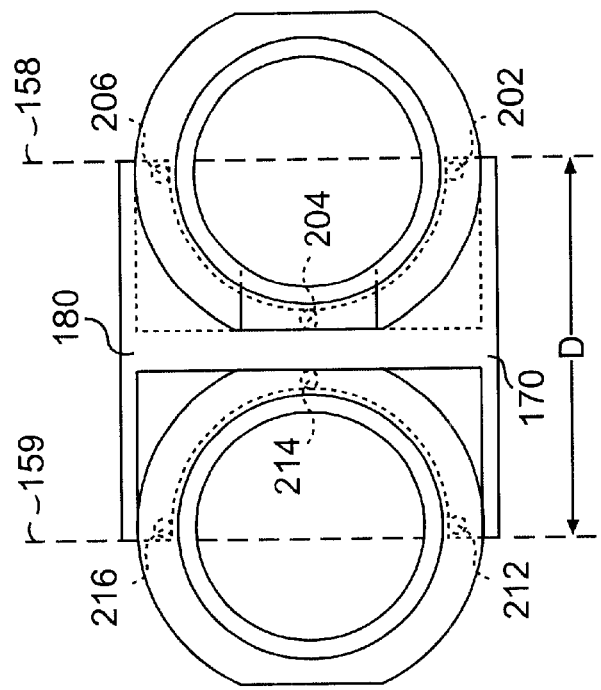
FIG. 10 is a top view of the catadioptric lens barrel structure illustrating the support structure and the adjustment articles.
Figure 9:
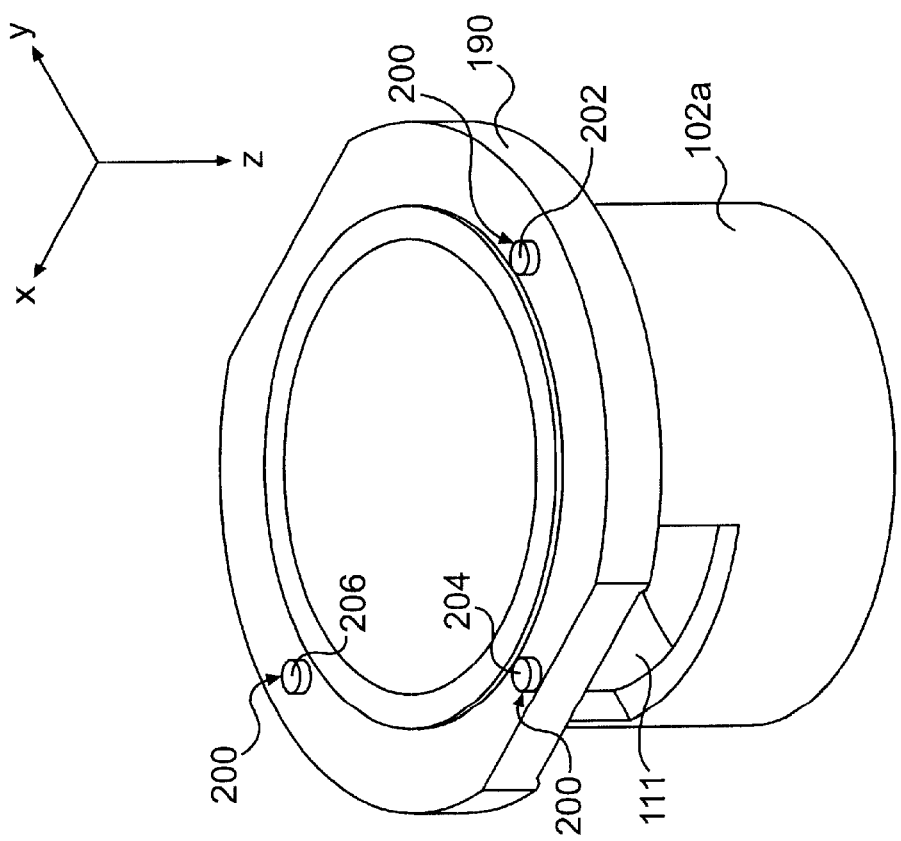
FIG. 9 is a perspective view of an inverted sub-barrel illustrating a plurality of adjustment articles.

FIGS. 9 and 10 illustrate an embodiment of catadioptric lens barrel structure 100 comprising a plurality of adjustment articles for adjusting linear shifts and angular tilts of each optical sub-axis with respect to the optical axis. The linear shifts include adjusting each sub-barrel in a linear direction parallel to the optical axis along the z-axis, and minimizing linear distance between the optical sub-axis and the optical axis along the x- and y-axes. The angular tilts include adjusting each sub-barrel to minimize an angle created between the optical sub-axis and the optical axis around the x-, y-, and z-axes. The adjustment articles comprise a plurality of washers 200 discreetly mounted between each flange 190 and the corresponding support platform 150a, 150b, 150c, 150d, or 160a, 160b, 160c, 160d, around the outer circumference of the corresponding sub-barrel 102a, 102b, 102c, 102d, or 1 12a, 1 12b, 112c, 112d, respectively. Each flange 190 is removably secured to the corresponding support platform 150a, 150b, 150c, 150d, or 160a, 160b, 160c, 160d, through the plurality of washers 200 by fastening means such as screws (not shown).

FIG. 9 shows a perspective view of an inverted sub-barrel 102a with flange 190 and a plurality of washers 200. Three washers 202, 204, and 206 are illustrated. FIG. 10 shows a top view of lens barrel structure 100, including washers 202, 204, 206, 212, 214, and 216 and lateral support panels 170 and 180. To maintain distance D, washers 202 and 206 on first lens barrel 102 are preferably located substantially aligned with first optical plane 158, and other washers 212, 216 (shown in FIG. 10) on second lens barrel 112 located substantially aligned with second optical plane 159. Each washer 202, 204, or 206 may have a circular shape with a segment opening (not shown) to obtain a configuration of a letter "C" so that a C-washer can be inserted between or removed from the flange and support platform at each position 202, 204, 206, 212, 214, and 216 without completely removing the fastening means. C-washers can be used to adjust misalignment linearly along the z-axis and angularly around the x-, y-, and z-axes. For example, if washers 202, 204, and 206 are implemented as C-washers, to make a linear adjustment along the z-axis, all three C-washers 202, 204, and 206 may be ground down by a uniform thickness, or, alternatively, may be replaced by another set of C-washers having a uniformly thicker thickness.

Figure 11:
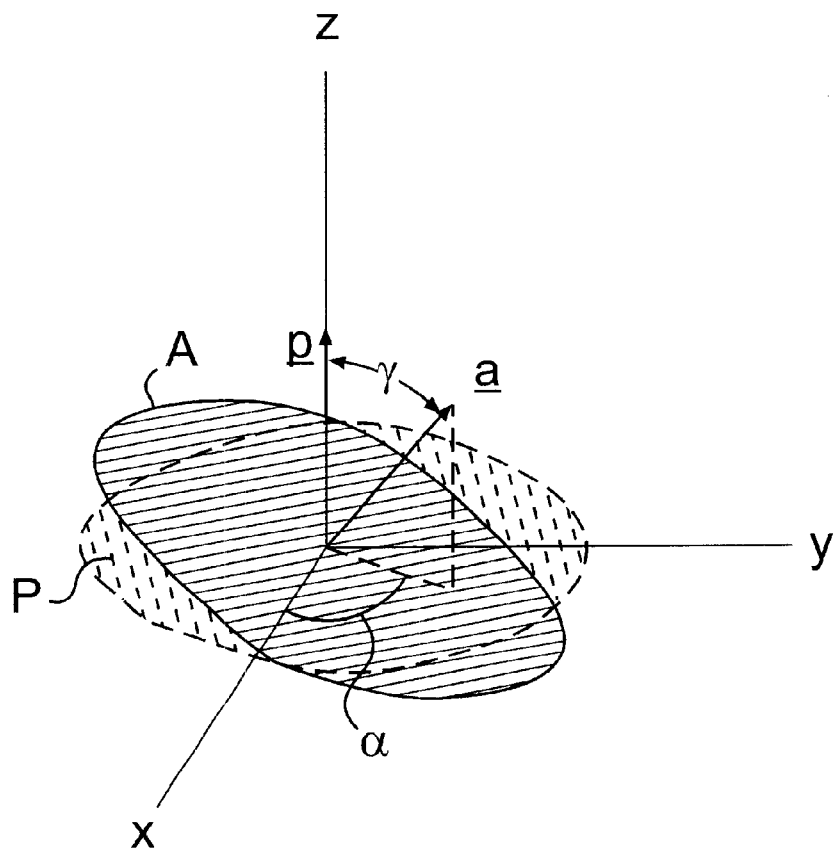
FIG. 11 is a diagram illustrating how to make angular adjustment around the x-, y-, and z-axes.

FIG. 11 illustrates simultaneous angular adjustment around the x-, y-, and z-axes. For example, the dotted ellipse represents a perfect alignment of sub-barrel P with sub-axis p coinciding with z-axis and a radial surface on xy-plane, while the solid ellipse represents an actual alignment of sub-barrel A with sub-axis a making an angle α from x-axis on xy-plane and an angle γ from z-axis . To make the angular adjustment, sub-barrel A is rotated around z-axis until sub-axis a aligns with either x- or y-axis, and then any one(s) of C-washers 202, 204, and 206 are ground down until sub-axis a aligns with z-axis.

The adjustment articles also comprise a plurality gauge blocks (not shown) to minimize linear distance between an optical sub-axis and the corresponding optical axis along the x- and y-axes. For example, the gauge blocks may comprise a set of rectangular sheets having various predetermined thicknesses. The gauge blocks are inserted between a sub-barrel and the corresponding support platform around the outer circumference of the sub-barrel. Other adjustment articles, such as a micrometer or a spacer, may also be used for this purpose. For example, to make a linear adjustment along the x- and y-axis, one or more gauge blocks may be inserted either along the x-axis, along the y-axis, or a combination of the x- and y-axes, which is anywhere around the outer circumference of the sub-barrel.

Sub-barrels 102a, 102b, 102c, 102d, and sub-barrels 112a, 112b, 112c, 112d, oftentimes need to be replaced. For example, the sub-barrels may need to be replaced to adjust the alignment of individual sub-barrels, to replace the lenses carried by the sub-barrels, or for maintenance purposes. The catadioptric lens barrel structure consistent with the principles of the present invention not only minimizes distortion errors due to temperature changes, vibrational, or other external forces, but it also facilitates replacing the sub-barrels. When any one of sub-barrels 102a, 102b, 102c, 102d, or sub-barrels 112a, 112b, 112c, 112d, needs to be replaced, on operator can simply remove the particular sub-barrel to either replace the sub-barrel with a new sub-barrel or make the necessary linear and angular alignment by adjusting the C-washers and the gauge blocks. Subsequently, the operator can easily slide the new sub-barrel or the adjusted sub-barrel back into alignment with the corresponding optical axis 104 or 114, and secure the sub-barrel to the corresponding support platform. Thus, the lens barrel structure according to this invention minimizes collective misalignment or distortion errors of the whole lens barrel structure because the operator can focus only on individual sub-barrel without disturbing the rest of the structure.

It will be apparent to those skilled in the art that various modifications and variations can be made in the catadioptric lens barrel structure, the material chosen for the present invention, and in construction of the number of lens barrels arrangement and the support structure as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. A lens barrel structure, comprising:
   a plurality of lens barrels, each lens barrel having an optical axis, the optical axes being substantially parallel to each other, and each lens barrel comprising a plurality of sub-barrels, the sub-barrels serially aligned along a respective optical axes;
   a support structure to support each sub-barrel and to maintain the substantial parallel alignment of the optical axes; and
   at least one transverse lens barrel between two of the lens barrels, the transverse lens barrel comprising a first reflective element having an angular orientation with respect to a first of the optical axes, and a second reflective element having an angular orientation with respect to a second of the optical axes.

2. A lens barrel structure, comprising:
   a lens barrel having an optical axis and comprising a plurality of sub-barrels serially aligned along the optical axis, each sub-barrel having an optical sub-axis substantially coinciding with the optical axis; and
   a support structure to support each sub-barrel and to maintain the substantially coinciding alignment of the corresponding optical sub-axis to the optical axis,
   wherein a gap is provided between consecutive sub-barrels so that each sub-barrel slidably fits in and out of alignment with the optical axis, and each sub-barrel is removably fastened to the support structure.

3. The lens barrel structure of claim 2, wherein the support structure is made of a material having a coefficient of thermal expansion of 6 ppm/° C. or below.

4. The lens barrel structure of claim 3, wherein the material is selected from the group consisting of alumina ceramic, Ultra Low Expansion™ glass, Zerodur glass, silicon carbide, and Invar.

5. A lens barrel structure, comprising:
   a lens barrel having an optical axis and comprising a plurality of sub-barrels serially aligned along the optical axis, each sub-barrel having an optical sub-axis substantially coinciding with the optical axis; and
   a support structure to support each sub-barrel and to maintain the substantially coinciding alignment of the corresponding optical sub-axis to the optical axis, the support structure comprising a main support panel positioned substantially parallel to the optical axis and a plurality of support platforms to support the sub-barrels, each support platform extending from the main support platform and partially circumscribing a corresponding sub-barrel.

6. The lens barrel structure of claim 5, wherein the support structure further comprises:
   a pair of lateral support panels to support the support platforms, the lateral support panels being perpendicular to the main support panel, and appressed against the plurality of support platforms.

7. The lens barrel structure of claim 5, wherein each sub-barrel comprises:
   a flange attached around an outer circumference of the sub-barrel, and removably secured to the corresponding support platform.

8. The lens barrel structure of claim 7, further comprising:
   a plurality of adjustment articles to maintain the substantially coinciding alignment of each optical sub-axis to the optical axis.

9. The lens barrel structure of claim 8, wherein the adjustment articles comprise:
   a plurality of washers discreetly mounted between the flange and the corresponding support platform around the outer circumference of the corresponding sub-barrel.

10. The lens barrel structure of claim 9, wherein the washers are adjustable for providing linear shift of the sub-barrel in a direction parallel to the optical axis.

11. The lens barrel structure of claim 9, wherein the washers are adjustable for providing angular tilt and rotation of the sub-barrel around the optical axis to minimize an angle created between the optical axis and the corresponding optical sub-axis.

12. The lens barrel structure of claim 8, wherein the adjustment articles comprise:
   at least one gauge block between a sub-barrel and the corresponding support platform on the outer circumference of the sub-barrel.

13. The lens barrel structure of claim 12, wherein the at least one gauge block is adjustable for providing radial alignment of the optical sub-axis to the optical axis to minimize a distance between the optical sub-axis and the optical axis.

14. A lens barrel structure, comprising:
   a plurality of lens barrels, each lens barrel having an optical axis, the optical axes being substantially parallel to each other, and each lens barrel comprising a plurality of sub-barrels, the sub-barrels serially aligned along a respective optical axes; and
   a support structure to support each sub-barrel and to maintain the substantial parallel alignment of the optical axes,
   wherein a gap is provided between two consecutive sub-barrels so that each sub-barrel slidably fits in and out of alignment with a respective optical axis, and each sub-barrel is removably fastened to the support structure.

15. The lens barrel structure of claim 14, wherein the support structure is made of a material having a coefficient of thermal expansion of 6 ppm/° C. or below.

16. The lens barrel structure of claim 15, wherein the material is selected from the group consisting of alumina ceramic, Ultra Low Expansion™ glass, Zerodur glass, silicon carbide, and Invar.

17. A lens barrel structure, comprising:
   a plurality of lens barrels, each lens barrel having an optical axis, the optical axes being substantially parallel to each other, and each lens barrel comprising a plurality of sub-barrels, the sub-barrels serially aligned along a respective optical axes; and a support structure to support each sub-barrel and to maintain the substantial parallel alignment of the optical axes, the support structure comprising at least one main support panel positioned between two lens barrels and a plurality of support platforms to support the sub-barrels, each support platform extending from the main support platform toward either one of the optical axes of the two lens barrels and partially circumscribing a corresponding sub-barrel of the either one of the two lens barrels.

18. The lens barrel structure of claim 17, wherein the support structure further comprises:

a pair of lateral support panels to support the support platforms, the lateral support panels being perpendicular to the main support panel, and appressed against the plurality of support platforms.

* * * * *